(12) United States Patent
Joo et al.

(10) Patent No.: US 6,884,673 B2
(45) Date of Patent: Apr. 26, 2005

(54) METHODS OF FORMING INTEGRATED CIRCUIT DEVICES HAVING METAL-INSULATOR-METAL (MIM) CAPACITOR

(75) Inventors: Jae-hyun Joo, Seoul (KR); Cha-young Yoo, Suwon (KR); Wan-don Kim, Kyungki-do (KR); Yong-kuk Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/160,646

(22) Filed: May 31, 2002

(65) Prior Publication Data

US 2002/0179954 A1 Dec. 5, 2002

(30) Foreign Application Priority Data

May 31, 2001 (KR) .................................. 10-2001-0030529

(51) Int. Cl.⁷ ............................................ H01L 21/8242
(52) U.S. Cl. ...................................... 438/240; 438/244
(58) Field of Search ............................... 438/239–240, 438/243–244; 257/304, 307, 311

(56) References Cited

U.S. PATENT DOCUMENTS

| | | | | |
|---|---|---|---|---|
| 6,294,424 B1 | * | 9/2001 | Kang et al. | 438/423 |
| 6,340,619 B1 | * | 1/2002 | Ko | 438/396 |
| 6,352,865 B2 | * | 3/2002 | Lee et al. | 438/3 |
| 6,455,371 B1 | * | 9/2002 | Yang et al. | 438/253 |
| 6,479,344 B2 | * | 11/2002 | Huang et al. | 438/253 |
| 6,479,364 B2 | * | 11/2002 | Shin et al. | 438/396 |
| 6,518,070 B1 | * | 2/2003 | Alluri et al. | 438/3 |
| 6,583,021 B2 | * | 6/2003 | Song | 438/396 |

FOREIGN PATENT DOCUMENTS

JP    2000082683    3/2000

OTHER PUBLICATIONS

Notice to Submit Response, Korean Application No. 10-2001-0030529, Feb. 27, 2003.

* cited by examiner

*Primary Examiner*—David S. Blum
(74) *Attorney, Agent, or Firm*—Myers Bigel Sibley & Sajovec

(57) ABSTRACT

In some embodiments, an integrated circuit device includes a substrate and an interlevel-insulating layer on the substrate that has a hole therein that exposes the substrate. A unitary lower electrode of a capacitor is disposed on the substrate and has a contact plug portion thereof that is disposed in the hole. A dielectric layer is on the lower electrode and an upper electrode of the capacitor is on the dielectric layer. In other embodiments, an integrated circuit device includes a substrate and an interlevel-insulating layer on the substrate that has a hole therein that exposes the substrate. A barrier layer is disposed on the exposed portion of the substrate and on sidewalls of the interlevel-insulating layer. A contact plug is disposed in the hole on the barrier layer. A lower electrode of a capacitor is disposed on the contact plug and engages the contact plug at a boundary therebetween. A dielectric layer is on the lower electrode and an upper electrode of the capacitor is on the dielectric layer.

15 Claims, 12 Drawing Sheets

US 6,884,673 B2

METHODS OF FORMING INTEGRATED CIRCUIT DEVICES HAVING METAL-INSULATOR-METAL (MIM) CAPACITOR

RELATED APPLICATION

This application claims the benefit of Korean Patent Application No. 2001-0030529, filed May 31, 2001, the disclosure of which is hereby incorporated herein by reference.

FIELD OF THE INVENTION

The present invention relates generally to integrated circuit devices, and, more particularly, to integrated circuit capacitors and methods of forming same.

BACKGROUND OF THE INVENTION

In general, as the integration density of integrated circuit devices increases, conventional metal-insulator-semiconductor (MIS) capacitors may have relatively low dielectrics so that they may not provide desired capacitance values. As a result, metal-insulator-metal (MIM) capacitors may be used to replace MIS capacitors.

FIG. 1 is a cross-sectional view of a conventional integrated circuit device that comprises a MIM capacitor. As shown in FIG. 1, a contact plug 15 is formed in an interlevel-insulating layer 13 on a substrate 11, e.g., a silicon substrate. The contact plug 15 may comprise a TiN layer and may be used as a barrier layer. A MIM capacitor 23 is formed on the contact plug 15. The contact plug 15 may connect the MIM capacitor 23 to a driving transistor (not shown) allowing charges to accumulate on the MIM capacitor 23 or be discharged from the MIM capacitor 23. The MIM capacitor 23 comprises a lower electrode 17, a dielectric layer 19, and an upper electrode 21. The lower electrode 17 and the upper electrode 21 may comprise a metal, such as Pt or Ru, and the dielectric layer 19 may comprise $Ta_2O_5$.

Unfortunately, cracks may occur in the interlevel-insulating layer 13 due to stress generated during the deposition of the TiN layer, i.e., the contact plug 15. Also, due to generally poor step coverage of the TiN layer, a seam may occur in the TiN layer if the TiN layer is deposited and then planarized by chemical mechanical polishing (CMP).

SUMMARY OF THE INVENTION

According to some embodiments of the present invention, an integrated circuit device comprises a substrate and an interlevel-insulating layer on the substrate that has a hole therein that exposes the substrate. A unitary lower electrode of a capacitor is disposed on the substrate and has a contact plug portion thereof that is disposed in the hole. A dielectric layer is on the lower electrode and an upper electrode of the capacitor is on the dielectric layer. Because the lower electrode and the contact plug comprise a unitary body, cracks in the interlevel-insulating layer may be reduced and a seam may not be created in the contact plug.

In other embodiments of the present invention, a barrier layer is disposed between the contact portion of the lower electrode and both the substrate and sidewalls of the interlevel-insulating layer. The barrier layer may comprise TiN, TiSiN, TiAlN, TaN, TaSiN, TaAlN, and/or alloys thereof, and may have a thickness in a range of about 30 Å to about 300 Å.

In still other embodiments, the lower electrode of the capacitor is cylindrical and the barrier layer has a thickness in a range of about 30 Å to about 300 Å.

In further embodiments of the present invention, a mold layer, which may comprise silicon oxide, is on the interlevel-insulating layer that has an opening therein through which the lower electrode of the capacitor is received. An etch stop layer may also be on the mold layer and have an opening therein through which the lower electrode of the capacitor is received. The etch stop layer may comprise silicon oxide and/or tantalum oxide.

In still further embodiments, the dielectric layer may comprise may comprise $Al_2O_3$, $Ta_2O_5$, TiO, (Ba, Sr)$TiO_3$, Pb(Zr, Ti)$O_3$, (Pb, La)(Zr, Ti)$O_3$, and/or alloys thereof and the upper and lower electrodes of the capacitor may comprise one or more platinum group metals, such as Pt, Ru, and Ir.

In other embodiments of the present invention, an integrated circuit device comprises a substrate and an interlevel-insulating layer on the substrate that has a hole therein that exposes the substrate. A barrier layer is disposed on the exposed portion of the substrate and on sidewalls of the interlevel-insulating layer. A contact plug is disposed in the hole on the barrier layer. A lower electrode of a capacitor is disposed on the contact plug and engages the contact plug at a boundary therebetween. A dielectric layer is on the lower electrode and an upper electrode of the capacitor is on the dielectric layer. Advantageously, the barrier layer may increase adhesion with the contact plug and may also reduce contact resistance. In particular embodiments, the barrier layer may comprise TiN, TiSiN, TiAlN, TaN, TaSiN, TaAlN, and/or alloys thereof, and may have a thickness in a range of about 30 Å to about 300 Å.

Although described above primarily with respect to device embodiments, the present invention may also be embodied as methods of forming integrated circuit devices.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF THE PREFERRED EMBODIMENT

Figure 1:
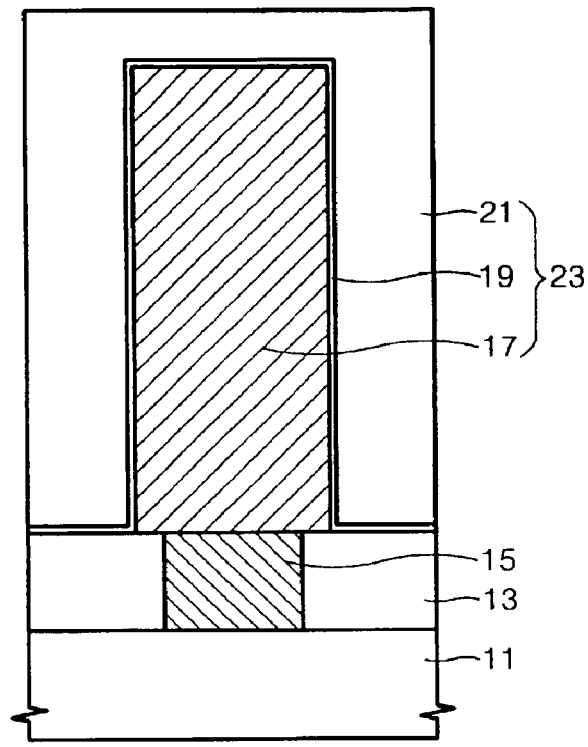
FIG. 1 is a cross-sectional view of a conventional integrated circuit device that includes a metal-insulator-metal (MIM) capacitor.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures. In the figures, the dimensions of layers and regions are exaggerated for clarity. It will also be understood that when an element, such as a layer, region, or substrate, is referred to as being "on" another element, it can be directly on the other element or intervening elements may be present. In contrast, when an element, such as a layer, region, or substrate, is referred to as being "directly on" another element, there are no intervening elements present.

Figure 2:
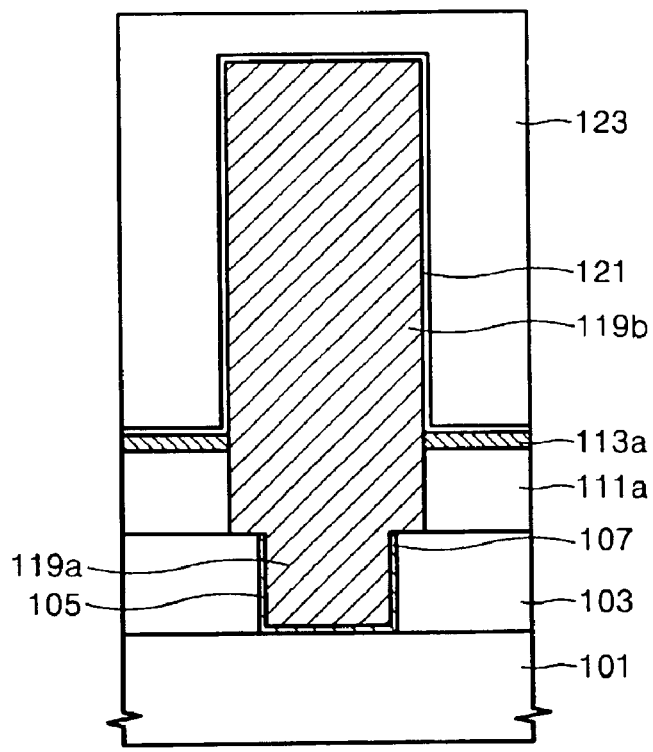
FIGS. 2–9 are cross sectional views that illustrate integrated circuit devices that comprise a MIM capacitor and methods of forming same in accordance with various embodiments of the present invention.

FIG. 2 is a cross-sectional view that illustrates integrated circuit devices having a MIM capacitor according to some embodiments of the present invention. As shown in FIG. 2, an interlevel-insulating layer 103 is disposed on, for example, a silicon substrate 101 and has a contact hole 105 formed therein that exposes a portion of the substrate 101. The interlevel-insulating layer 103 may comprise silicon oxide. A barrier layer 107 is formed along the sidewalls and bottom of the contact hole 105 to fill a portion thereof. The barrier layer 107 may be used to increase adhesion between the barrier layer 107 and a contact plug 119a, which will be subsequently formed, and to lower contact resistance. The barrier layer 107 may comprise TiN, TiSiN, TiAlN, TaN, TaSiN, TaAlN, and/or alloys thereof, and may have a thickness in a range of about 30 Å to about 300 Å.

A contact plug 119a comprising a metal is disposed in the contact hole 105. Moreover, a lower electrode 119b extends from the contact plug 119a and the contact hole 105. Thus, the contact plug 119a and the lower electrode 119b comprise a unitary body. The contact plug 119a and the lower electrode 119b may comprise one or more platinum group metals, such as Pt, Ru, and/or Ir. The lower electrode 119b may be viewed as a stack type electrode. Advantageously, the contact plug 119a filling the contact hole 105 comprises the same metal as the lower electrode 119b, instead of, for example, TiN. As a result, cracks in the interlevel-insulating layer 103 may be reduced, and a seam may not be created in the contact plug 119a.

A lower mold layer pattern 111a and a wet etch stop pattern 113a are formed on the interlevel-insulating layer 103 and at both sides of the lower electrode 119b. The lower mold layer pattern 11a may provide enhanced stability in forming the lower electrode 119b. The wet etch stop pattern 113a may protect the lower mold layer pattern 111a and/or the interlevel-insulating layer 103 during manufacturing processing of the capacitor.

A dielectric layer 121 is formed on the lower electrode 119b. The dielectric layer 121 may comprise $Al_2O_3$, $Ta_2O_5$, TiO, (Ba, Sr)$TiO_3$, Pb(Zr, Ti)$O_3$, (Pb, La)(Zr, Ti)$O_3$, and/or alloys thereof. An upper electrode 123 is formed on the dielectric layer 121. The upper electrode 123 may comprise one or more platinum group metals, such as Pt, Ru, and/or Ir. Thus, a MIM capacitor, according to some embodiments of the present invention, comprises the lower electrode 119b, the dielectric layer 121, and the upper electrode 123. The contact plug 119a may connect the MIM capacitor to a driving transistor (not shown) allowing charges to accumulate on the MIM capacitor or be discharged from the MIM capacitor.

Figure 3:
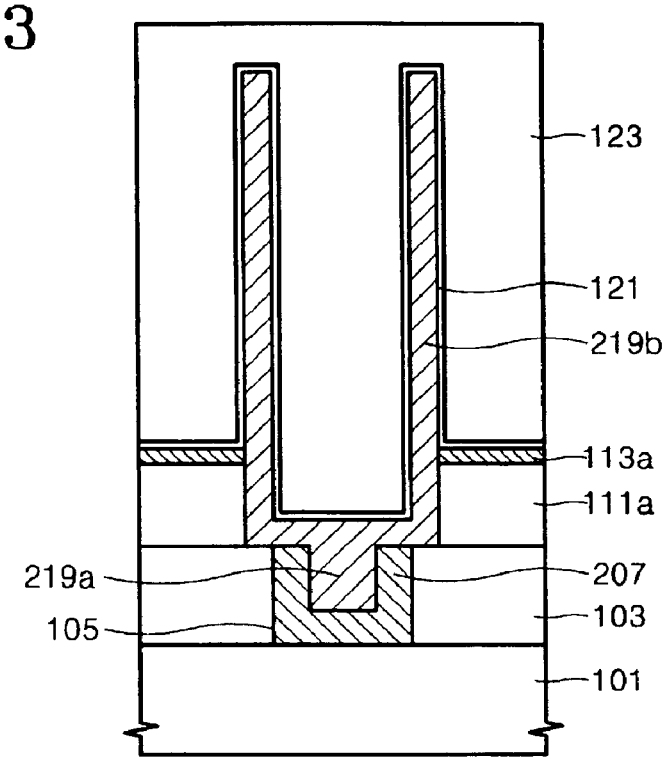

FIG. 3 is a cross-sectional view that illustrates integrated circuit devices having a MIM capacitor according to further embodiments of the present invention. Embodiments of integrated circuit devices illustrated in FIG. 3 are similar to the integrated circuit device embodiments discussed above with respect to FIG. 2, with the exception that a barrier layer 207, which is formed along the sidewalls and the bottom of the contact hole 105, is thicker than the barrier layer 107 of FIG. 2, and a lower electrode 219b of a capacitor is cylindrical. The barrier layer 207 may comprise TiN, TiSiN, TiAlN, TaN, TaSiN, TaAlN, and/or alloys thereof, and may have a thickness in a range of about 30 Å to about 300 Å. Similar to the description above with respect to FIG. 2, a contact plug 219a may fill the contact hole 105. A lower electrode 219b extends from the contact plug 219a and the contact hole 105. Because the lower electrode 219b of the MIM capacitor is cylindrical, the capacitance may be increased.

Figure 4:
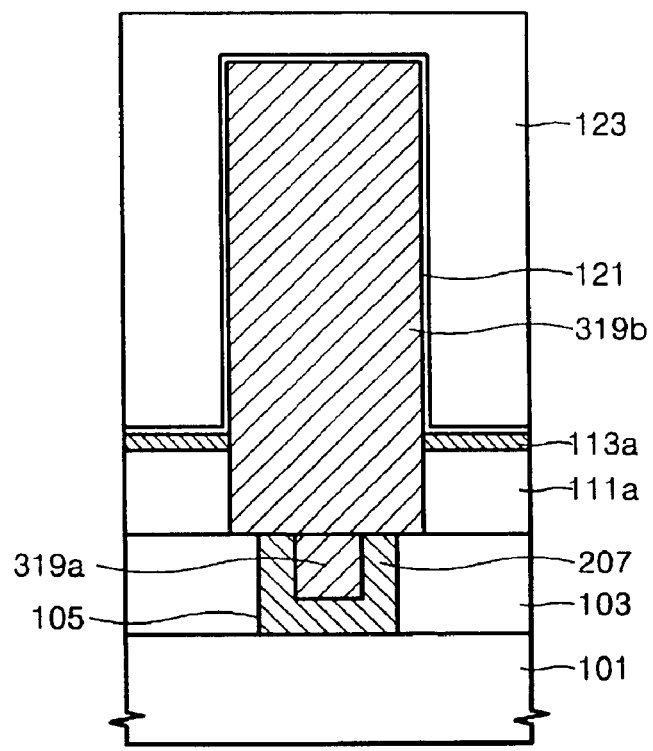

FIG. 4 is a cross-sectional view that illustrates integrated circuit devices having a MIM capacitor according to further embodiments of the present invention. Embodiments of integrated circuit devices illustrated in FIG. 3 are similar to integrated circuit device embodiments discussed above with respect to FIG. 2, with the exception that the barrier layer 207, which is formed along the sidewalls and the bottom of the contact hole 105, is thicker than the barrier layer 107 of FIG. 2, and a contact plug 319a and a lower electrode 319b do not comprise a unitary body. The barrier layer 207 may comprise TiN, TiSiN, TiAlN, TaN, TaSiN, TaAlN, and/or alloys thereof, and may have a thickness in a range of about 30 Å to about 300 Å.

Figure 5:
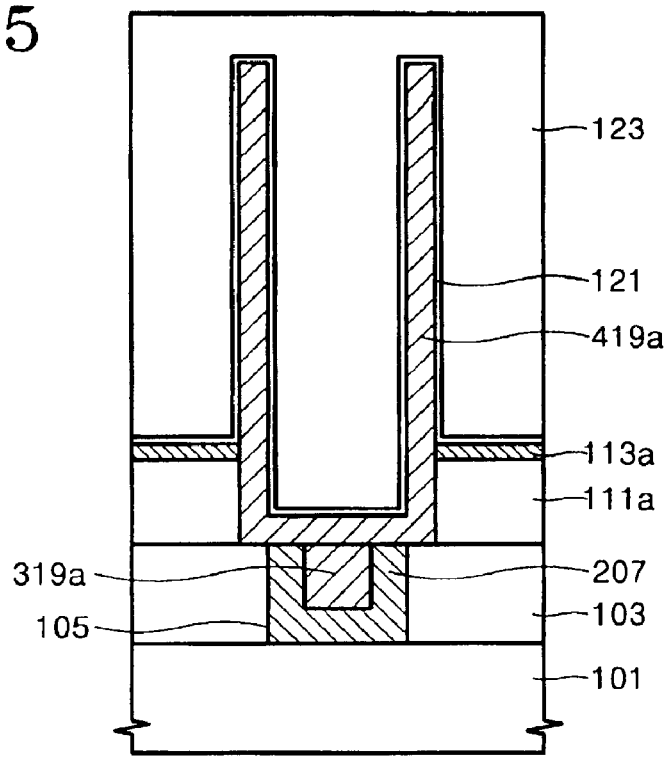

FIG. 5 is a cross-sectional view that illustrates integrated circuit devices having a MIM capacitor according to further embodiments of the present invention. Embodiments of integrated circuit devices illustrated in FIG. 5 are similar to integrated circuit device embodiments discussed above with respect to FIG. 4, with the exception that a lower electrode 419a of the MIM capacitor is cylindrical.

Figure 6A:
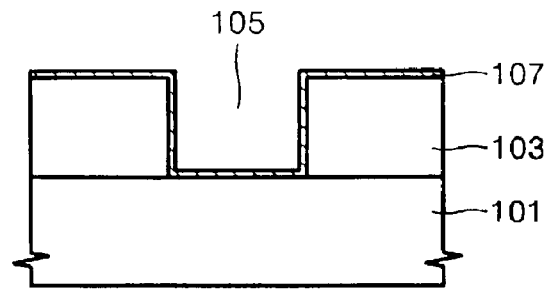

Methods of fabricating integrated circuit devices having a MIM capacitor, in accordance with various embodiments of the present invention, will now be described. FIGS. 6A through 6H are cross-sectional views that illustrate operations in fabricating integrated circuit devices having a MIM capacitor according to some embodiments of the present invention described above with reference to FIG. 2. Referring now to FIG. 6A, an interlevel-insulating layer 103 is formed on a substrate 101, which may comprise silicon. The interlevel-insulating layer 103 may comprise silicon oxide. The interlevel-insulating layer 103 is patterned by photolithography to form a first contact hole 105. A barrier layer 107 is formed on the surface of the semiconductor substrate 101. A barrier layer 107 is formed along the sidewalls and bottom of the first contact hole 105 and on the interlevel-insulating layer 103 without filling the first contact hole 105. The barrier layer 107 may comprise TiN, TiSiN, TiAlN, TaN, TaSiN, TaAlN, and/or alloys thereof, and may have a thickness in a range of about 30 Å to about 300 Å.

Figure 6B:
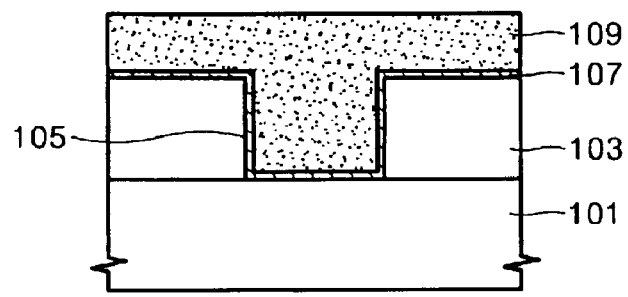
Figure 6C:
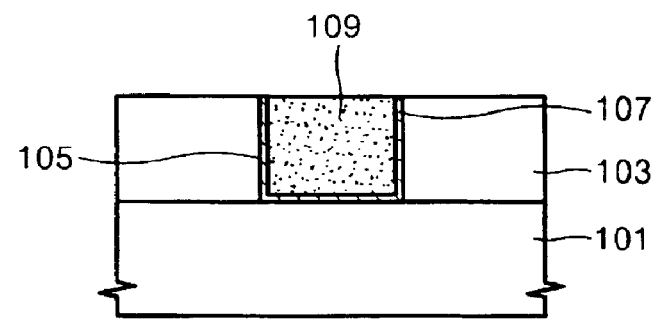

Referring now to FIGS. 6B and 6C, a first sacrificial layer 109 is formed on the surface of the substrate 101 to fill the first contact hole 105. In other words, the first sacrificial layer 109 fills the first contact hole 105 and is formed on the interlevel-insulating layer 103. The first sacrificial layer 109 may be a flowable oxide layer.

The first sacrificial layer 109 is planarized using the upper surface of the interlevel-insulating layer 103 as an etch stop, leaving the first sacrificial layer 109 in the first contact hole 105. The planarization of the first sacrificial layer 109 may be performed by CMP (Chemical Mechanical Polishing). The barrier layer 107 on the interlevel-insulating layer 103 may also etched during planarization of the first sacrificial layer 109. In other words, the barrier layer 107 may remain only along the sidewalls and bottom of the first contact hole 105. Thus, a barrier layer in one cell may be separated from a barrier layer in another cell.

Figure 6D:
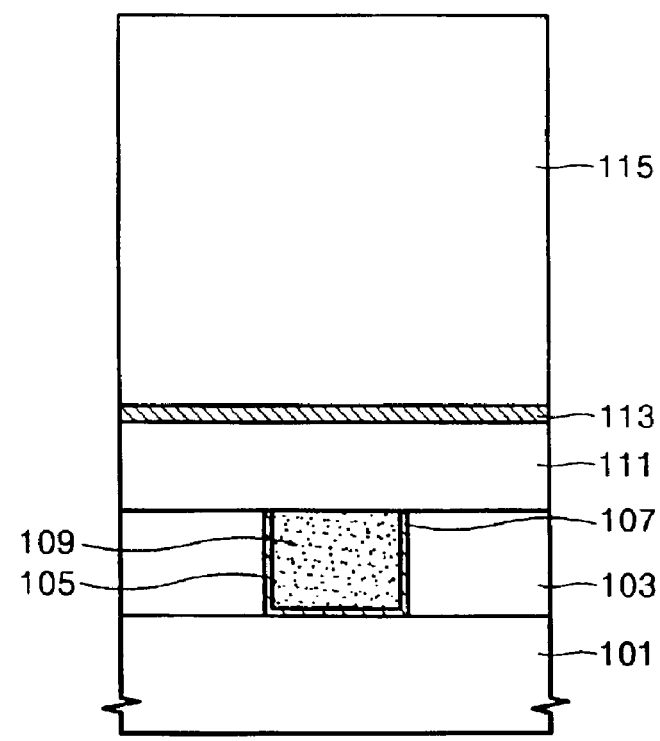

Referring to FIG. 6D, a lower mold layer 111 is formed on the first sacrificial layer 109 and the interlevel-insulating layer 103. The lower mold layer 111 may comprise silicon oxide. The lower mold layer 111 may allow a lower electrode of the MIM capacitor to be formed with improved stability subsequently.

A wet etch stop layer 113 is formed on the lower mold layer 111. The wet etch stop layer 113 may protect the lower mold layer 111 and/or the interlevel-insulating layer 103 from manufacturing processes. The wet etch stop layer 113 may comprise silicon oxide, tantalum oxide, and/or combinations thereof. An upper mold layer 115 is formed on the wet etch stop layer 113. The upper mold layer 115 may comprise silicon oxide.

Figure 6E:
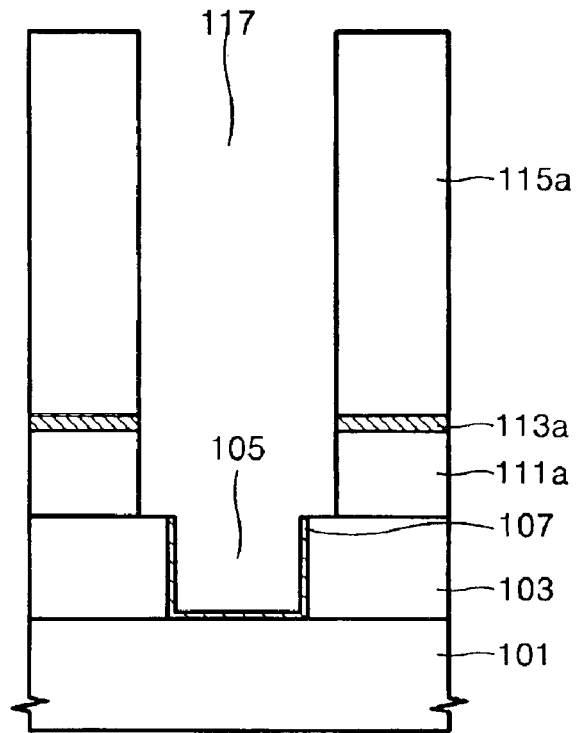

Referring now to FIG. 6E, the upper mold layer 115, the wet etch stop layer 113, and the lower mold layer 111 are patterned to form a second contact hole 117 exposing an upper surface of the first sacrificial layer 109. Thus, an upper mold layer pattern 115a, a wet etch stop layer pattern 113a, and a lower mold layer pattern 111a are formed on the interlevel-insulating layer 103.

The first sacrificial layer 109 in the first contact hole 105 is removed by wet etching. Because the first sacrificial layer 109 in the first contact hole 105 is a flowable oxide layer, it may be etched faster than the interlevel-insulating layer 103 and the lower and upper mold layers 111 and 115. Thus, the first sacrificial layer 109 in the first contact hole 105 may be removed with minimal damage to the interlevel-insulating layer 103 and/or the lower and upper mold layers 111 and 115. As a result, the barrier layer 107 in the first contact hole 105 is exposed.

Figure 6F:
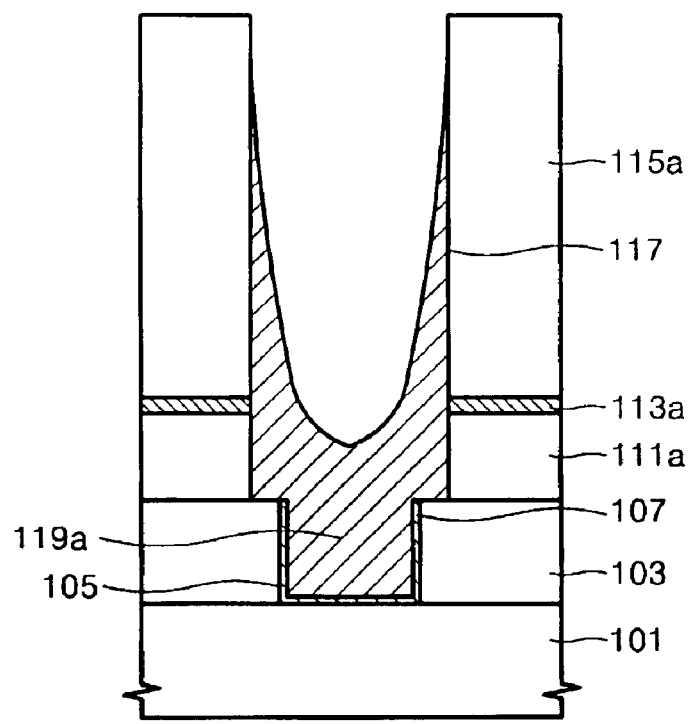

Referring now to FIG. 6F, a metal layer is formed on the substrate in the first and second contact holes 105 and 117 and then the metal layer is reflowed using a high thermal treatment to form a contact plug 119a, which fills the first contact hole 105. The formation and reflow of the metal layer using a thermal treatment may inhibit a seam from occurring in the metal layer due to poor step coverage when the metal layer is formed. The contact plug 119a may comprise a platinum group metal, such as Pt, Ru, and/or Ir.

Figure 6G:
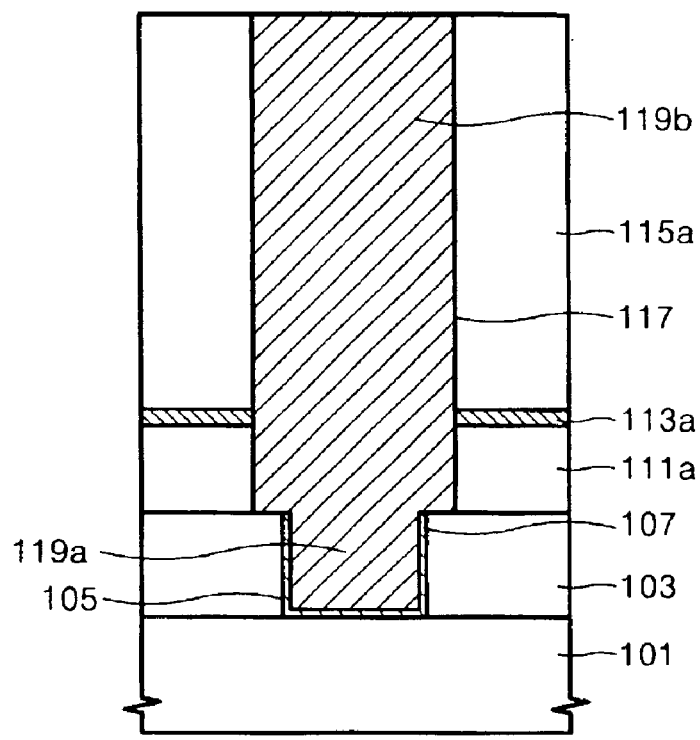

Referring now to FIG. 6G, the second contact hole 117 is filled with the same metal filling the first contact hole 105 to form a lower electrode 119b of a stack type capacitor. The lower electrode 119b may comprise a platinum group metal, such as Pt, Ru, and/or Ir. As a result, the contact plug 119a and the lower electrode 119b comprise a unitary body and fill the first and second contact holes 105 and 117.

Figure 6H:
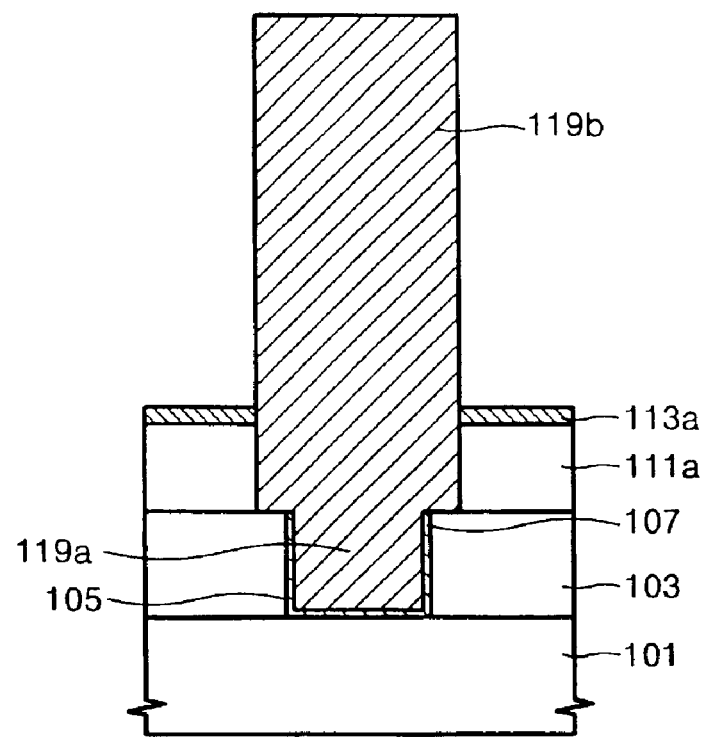

Referring to FIG. 6H, the upper mold layer pattern 115a is removed by wet etching using the wet etch stop pattern 113a as an etch stop. The wet etching of the upper mold layer pattern 115 may be performed for a few tens to hundreds of seconds using an oxide etchant, e.g., a buffered oxide etchant.

Next, as shown in FIG. 2, a dielectric layer 121 is formed on the surface of the semiconductor substrate 101. The dielectric layer 121 may comprise $Al_2O_3$, $Ta_2O_5$, TiO, (Ba, Sr)TiO$_3$, Pb(Zr, TiO$_3$, and/or (Pb, La)(Zr, Ti)O$_3$. An upper electrode 123 comprising a metal is formed on the dielectric layer 121 to complete an integrated circuit device having a MIM capacitor. The upper electrode 123 may comprise a platinum group metal, such as Pt, Ru, and/or Ir.

Figure 7A:
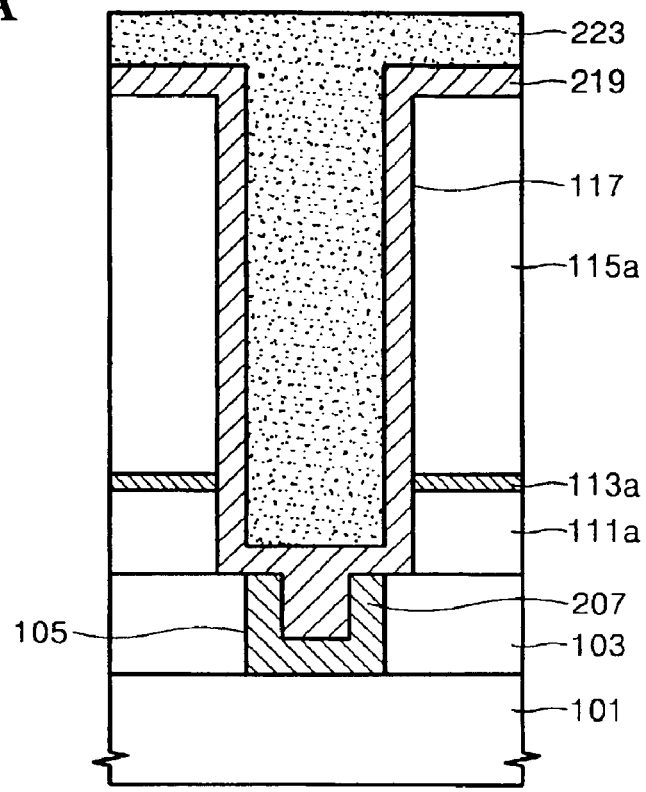
Figure 7B:
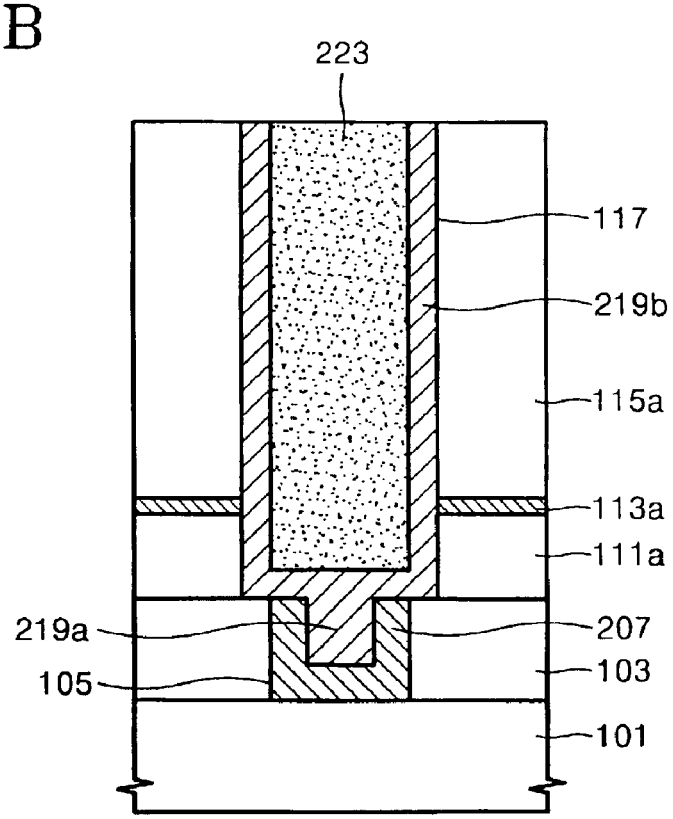
Figure 7C:
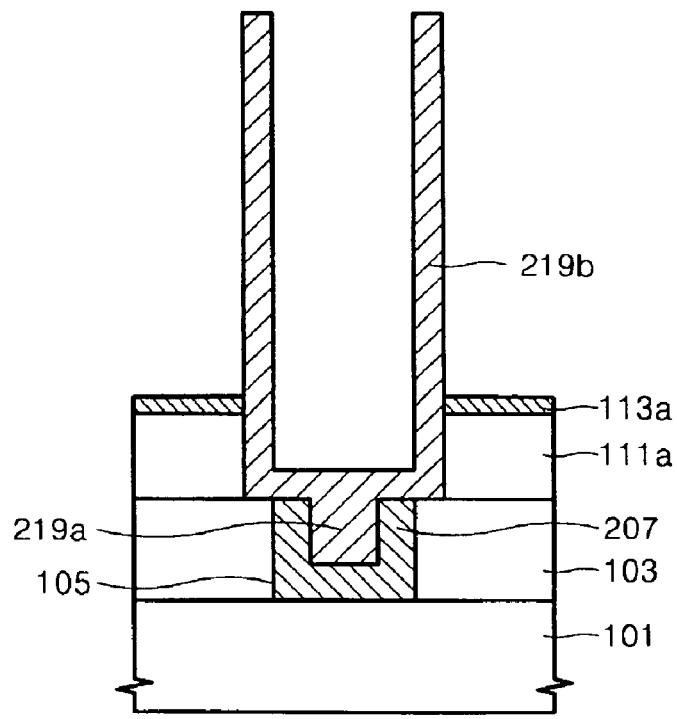

FIGS. 7A through 7C are cross-sectional views that illustrate operations in fabricating integrated circuit devices having a MIM capacitor according to some embodiments of the present invention described above with reference to FIG. 3. Methods of fabricating an integrated circuit device according to embodiments of the present invention illustrated in FIG. 3 are similar to methods of fabricating an integrated circuit device according to embodiments of the present invention illustrated in FIG. 2, with the exception that a barrier layer 207, which is formed along the sidewalls and the bottom of the contact hole 105, is thicker than the barrier layer 107 of FIG. 2, and a lower electrode 219b of a capacitor is cylindrical. The barrier layer 207 may comprise TiN, TiSiN, TiAlN, TaN, TaSiN, TaAlN, and/or alloys thereof, and may have a thickness in a range of about 30 Å to about 300 Å.

First, the operations described above with reference to FIGS. 6A through 6E are performed. Referring now to FIG. 7A, a metal layer 219 is formed on the substrate 101 on which the barrier layer 207 is formed along the sidewalls and bottom of the first contact hole 105 to fill the first contact hole 105. The metal layer 219 is used as a contact plug and a lower electrode. The metal layer 219 is formed along the sidewalls and bottom of the second contact hole 117 and on the surface of the upper mold layer pattern 115a to fill the first contact hole 105, but not the second contact hole 117. A second sacrificial layer 223 is formed on the substrate 101 on which the metal layer 219 is formed to fill the second contact hole 117. The second sacrificial layer 223 may comprise a flowable oxide.

Referring now to FIG. 7B, the second sacrificial layer 223 is patterned using the upper mold layer pattern 115a as an etch stop to leave the second sacrificial layer 223 only in the second contact hole 117. The metal layer 219 on the upper mold layer pattern 115a is etched and the second sacrificial layer 223 is planarized using CMP. As a result, a contact plug 219a is formed that fills the first contact hole 105, and a lower electrode 219b of a capacitor having a cylindrical shape is formed along the sidewalls and bottom of the second contact hole 117.

Referring now to FIG. 7C, the second sacrificial layer 223 left in the second contact hole 117 is removed. The upper mold layer pattern 115 is removed using the wet etch stop pattern 111a as an etch stop. Because the second sacrificial layer 223 left in the second contact hole 117 comprises a flowable oxide, the upper mold layer pattern 115a and the second sacrificial layer 223 may be simultaneously etched.

As shown in FIG. 3, a dielectric layer 121 and an upper electrode 123 are formed on the substrate 101 on which the lower electrode 219b is formed, thereby completing a semiconductor device having a MIM capacitor.

FIGS. 8A through 8F are cross-sectional views that illustrate operations in fabricating integrated circuit devices having a MIM capacitor according to some embodiments of the present invention described above with reference to FIG. 4. Methods of fabricating an integrated circuit device according to embodiments of the present invention illustrated in FIG. 4 are similar to methods of fabricating an integrated circuit device according to embodiments of the present invention illustrated in FIG. 2, with the exception that the barrier layer 207, which is formed along the sidewalls and the bottom of the contact hole 105, is thicker than the barrier layer 107 of FIG. 2, and a contact plug 319a and a lower electrode 319b do not comprise a unitary body.

Figure 8A:
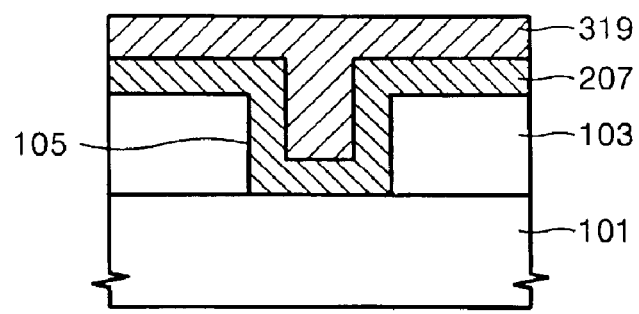

Referring now to FIG. 8A, an interlevel-insulating layer 103 is formed on a semiconductor substrate 101, which may comprise silicon. The interlevel-insulating layer 103 may comprise silicon oxide. The interlevel-insulating layer 103 is patterned by photolithography to form a first contact hole 105.

A barrier layer 207 is formed on the semiconductor substrate 101 in which the first contact hole 105 is formed. The barrier layer 207, which is thicker than the barrier layer 107 shown in FIG. 6A, is formed along the sidewalls and bottom of the first contact hole 105 and on the interlevel-insulating layer 103 without filling the first contact hole 105. The barrier layer 207 may comprise TiN, TiSiN, TiAlN, TaN, TaSiN, TaAlN, and/or alloys thereof, and may have a thickness in a range of about 30 Å to about 300 Å. A metal layer 319 for a contact plug is formed on the surface of the semiconductor substrate to fill the first contact hole 105. The metal layer 319 for a contact plug may comprise a platinum group metal, such as Pt, Ru, and/or Ir.

Figure 8B:
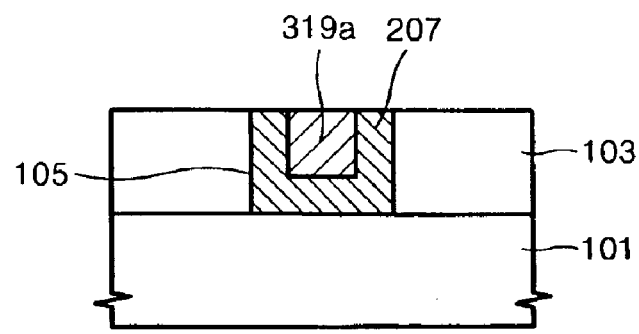

Referring now to FIG. 8B, the metal layer 319 for a contact plug and the barrier layer 207 are planarized using the interlevel-insulating layer 103 as an etch stop. The planarization of the metal layer 319 for a contact plug and the barrier layer 207 may be performed using CMP. The barrier layer 207 remains along the sidewalls and bottom of the first contact hole 105. A contact plug 319a is formed in the first contact hole 105 on the barrier layer 207. Thus, a barrier layer and a contact plug in one cell are separated from a barrier layer and a contact plug in another cell.

Figure 8C:
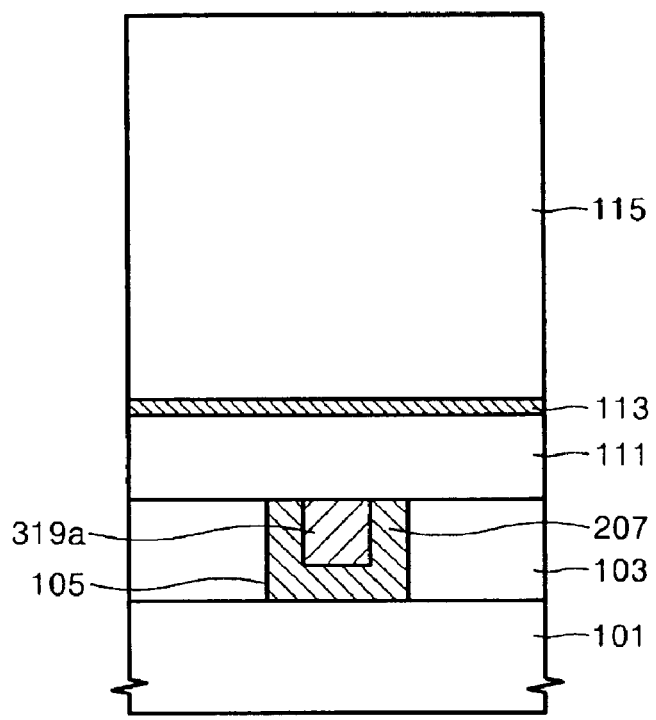

Referring now to FIG. 8C, a lower mold layer 111, a wet etch stop layer 113, and an upper mold layer 115 are formed on the contact plug 319a, the barrier layer 207, and the interlevel-insulating layer 103. The lower mold layer 111, the wet etch stop layer 113, and the upper mold layer 115 may comprise the same materials and perform the same functions as described above with reference to FIG. 6D.

Figure 8D:
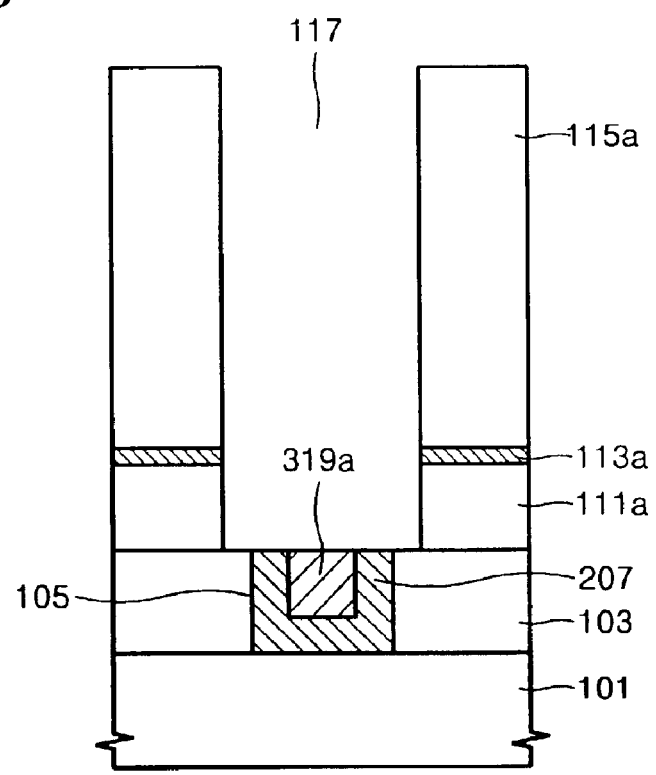

Referring now to FIG. 8D, the upper mold layer 115, the wet etch stop layer 113, and the lower mold layer 111 are patterned to form a second contact hole 117 that exposes the upper surface of the contact plug 319a and the barrier layer 207. Thus, an upper mold layer pattern 115a, a wet etch stop pattern 113a, and a lower mold layer pattern 111a are formed on the interlevel-insulating layer 103.

Figure 8E:
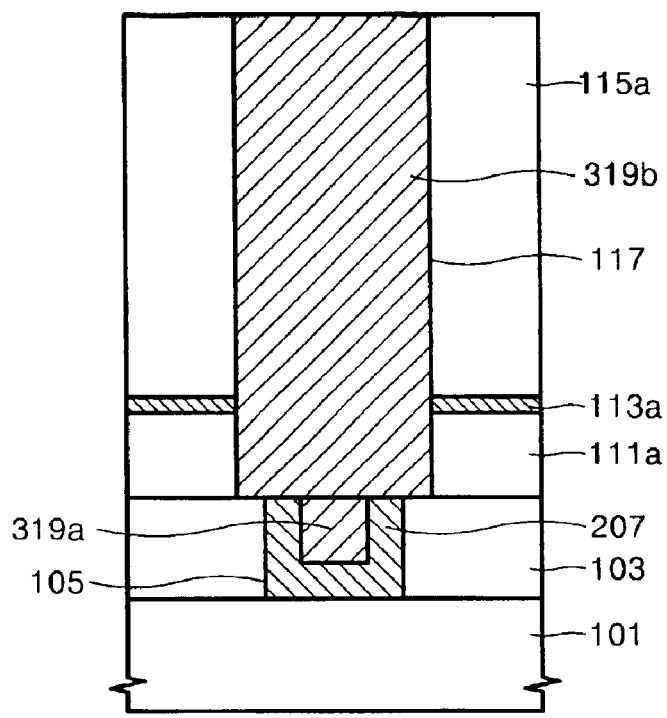

Referring now to FIG. 8E, the second contact plug 117 is filled with the same metal as the contact plug 319a to form a lower electrode 319b of a stack type capacitor. The metal used to form the lower electrode 319b may comprise a platinum group metal, such as Pt, Ru, and/or Ir. As a result, the contact plug 319a and the lower electrode 319b fill the first and second contact holes 105 and 117.

Figure 8F:
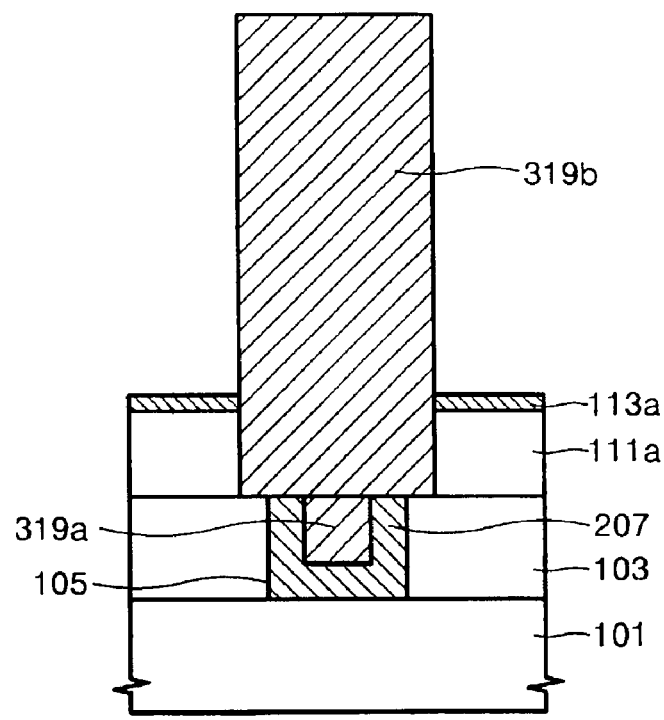

Referring now to FIG. 8F, the upper mold layer pattern 115a is removed by wet etching using the wet etch stop pattern 113a as an etch stop as shown in FIG. 6H. As shown in FIG. 4, a dielectric layer 121 and an upper electrode 123 are formed on the semiconductor substrate 101 on which the lower electrode 319b is formed, thereby completing a semiconductor device having a MIM capacitor.

Figure 9A:
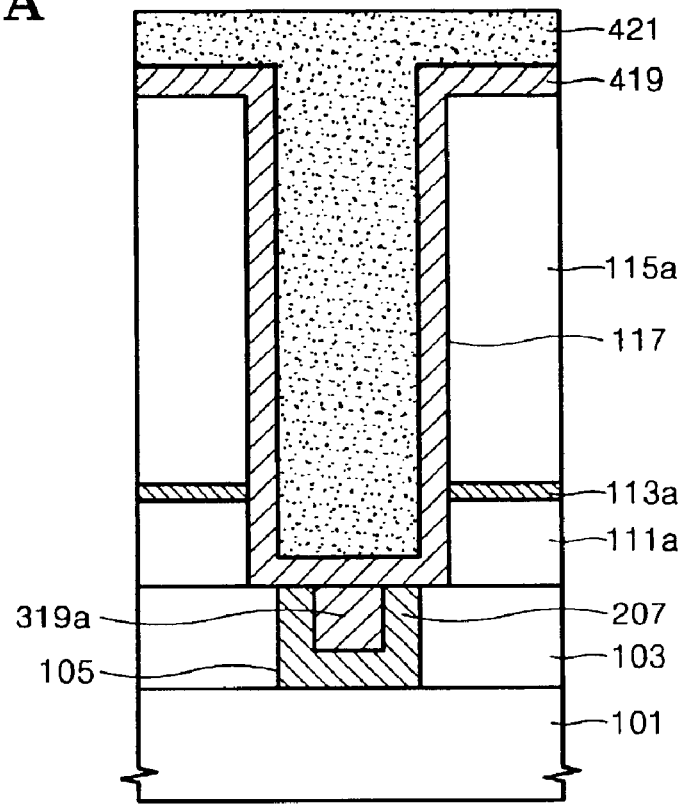
Figure 9B:
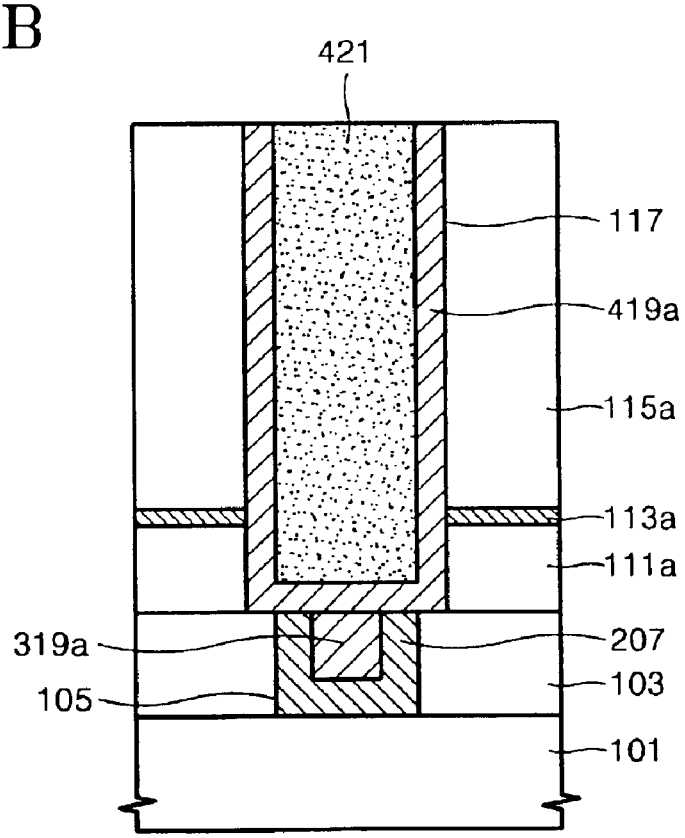
Figure 9C:
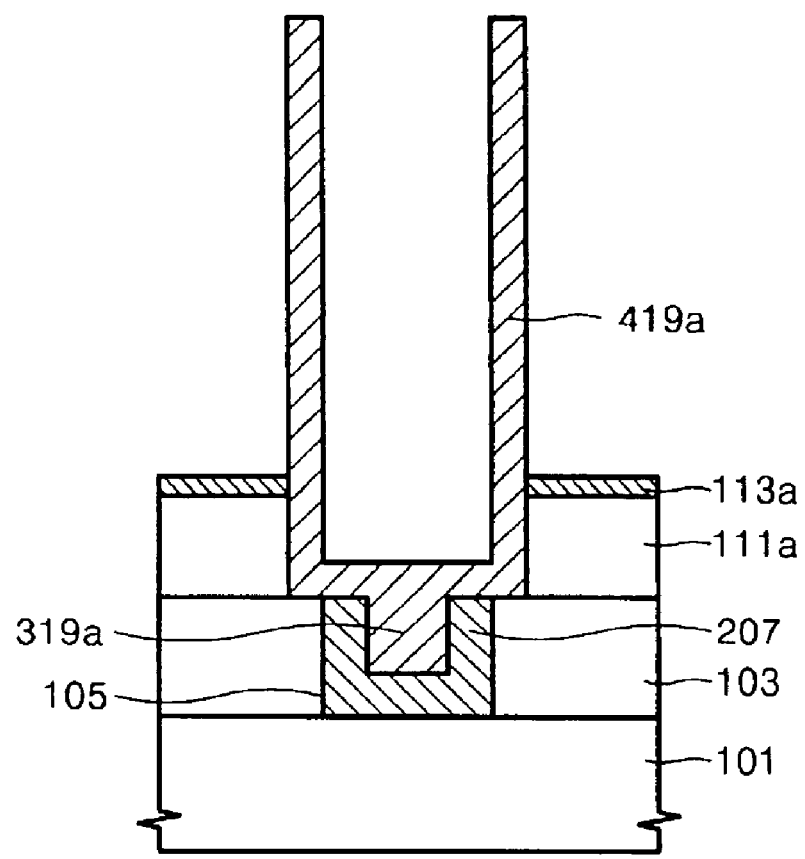

FIGS. 9A through 9C are cross-sectional views that illustrate operations in fabricating integrated circuit devices having a MIM capacitor according to some embodiments of the present invention described above with reference to FIG. 5. Methods of fabricating an integrated circuit device according to embodiments of the present invention illustrated in FIG. 5 are similar to methods of fabricating an integrated circuit device according to embodiments of the present invention illustrated in FIG. 4, with the exception that a lower electrode 419a of the MIM capacitor is cylindrical.

First, the operations described above with reference to FIGS. 8A through 8D are performed. Referring now to FIG. 9A, a metal layer 419 for a lower electrode is formed on the substrate 101 on which a second contact hole 117 is formed to expose upper surfaces of a contact plug 319a and a barrier layer 207. The metal layer 419 is formed along the sidewalls and bottom of the second contact hole 117 and on an upper mold layer pattern 115a, but does not fill the second contact hole 117. A sacrificial layer 421 is formed on the surface of the substrate 101 to fill the second contact hole 117. The sacrificial layer 421 may comprise a flowable oxide.

Referring now to FIG. 9B, the sacrificial layer 421 is planarized using the upper mold layer pattern 115a as an etch stop so that the sacrificial layer 421 remains only in the second contact hole 117. The metal layer 419 on the upper mold layer pattern 115a is etched and the sacrificial layer 421 is planarized using CMP. As a result, a lower electrode 419a is formed along the sidewalls and bottom of the second contact hole 117.

Referring now to FIG. 9C, the sacrificial layer 421 remaining in the second contact hole 117 is removed. The upper mold layer pattern 115a is removed using the wet etch stop pattern 113a as an etch stop. Because the sacrificial layer 421 remaining in the second contact hole 117 is flowable oxide, the upper mold layer pattern 115a and the sacrificial layer 421 may be simultaneously etched. As shown in FIG. 5, a dielectric layer 121 and an upper electrode 123 are formed on the substrate 101 on which the lower electrode 419a is formed, thereby completing a semiconductor device having a MIM capacitor.

As described above, in integrated circuit devices according to embodiments of the present invention, a contact plug filling a contact hole may comprise a metal as a lower electrode instead of TiN. As a result, cracks in an interlevel-insulating layer may be reduced and a seam in the contact plug may be avoided. Moreover, a barrier layer may be formed along the sidewalls and bottom of the contact hole to increase adhesion between the barrier layer and the contact plug and to reduce contact resistance.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. A method of forming an integrated circuit device, comprising:
   providing a substrate;
   forming an interlevel-insulating layer on the substrate that has a hole therein that exposes the substrate;
   forming a lower mold layer and an upper mold layer sequentially on the interlevel-insulating layer that have an opening therein that is wider than the hole;
   forming a unitary lower electrode of a capacitor that is disposed on the substrate and is received through the opening in the upper and lower mold layers and has contact plug portion thereof that is disposed in the hole;
   removing the upper mold layer;
   forming a dielectric layer on the lower electrode of the capacitor; and
   forming an upper electrode of the capacitor on the dielectric layer.

2. The method of claim 1, further comprising:
   forming a barrier layer between the contact plug portion of the lower electrode of the capacitor and both the substrate and sidewalls of the interlevel-insulating layer.

3. The method of claim 1, further comprising:
   forming an etch stop layer on the lower mold layer that has an opening therein through which the lower electrode of the capacitor is received.

4. The method of claim 1, wherein the upper an lower electrodes of the capacitor comprise Pt, Ru, and/or Ir.

5. The method of claim 1, wherein forming the lower mold layer and the upper mold layer comprises:
   filling the hole with a sacrificial layer;

forming the lower mold layer, an etch stop layer, and an upper mold layer sequentially on the sacrificial layer and the interlevel insulating layer;

patterning the upper mold layer, the etch stop layer, and the lower mold layer to form an opening exposing an upper surface of the sacrificial layer; and removing the sacrificial layer from the hole.

6. The method of claim 1, wherein removing the upper mold layer comprises:

removing the upper mold layer using wet etching.

7. The method of claim 1, wherein the lower electrode of the capacitor has a cylindrical shape that partially fills the opening along sidewalls of the upper and lower mold layers.

8. A method of forming an integrated circuit device, comprising:

providing a substrate;

forming an interlevel-insulating layer on the substrate that has a hole therein that exposes the substrate;

forming a contact plug in the hole on the barrier layer;

forming a lower mold layer and an upper mold layer sequentially on the interlevel-insulating layer that have an opening therein that is wider than the hole;

forming a lower electrode of a capacitor that is disposed on the contact plug and engages the contact plug at a boundary therebetween, the lover electrode being received through the opening in the lower and the upper mold layers;

removing the upper mold layer;

forming a dielectric layer on the lower electrode of the capacitor; and forming an upper electrode of the capacitor on the dielectric layer.

9. The method of claim 8, further comprising:

forming an etch stop layer on the lower mold layer that has an opening therein through which the lower electrode of the capacitor is received.

10. The method of claim 8, wherein the upper and lower electrodes of the capacitor comprise Pt, Ru, and/or Ir.

11. The method of claim 8, further comprising:

forming a barrier layer on the exposed portion of the substrate and on sidewalls of the interlevel-insulating layer.

12. The method of claim 8, wherein removing the upper mold layer comprises:

removing the upper mold layer using wet etching.

13. The method of claim 8, wherein the lower electrode of the capacitor has a cylindrical shape that partially fills the opening along sidewalls of the upper and the lower mold layers.

14. A method of forming an integrated circuit device, comprising:

providing a substrate;

forming an interlevel-insulating layer on the substrate;

patterning the interlevel-insulating layer to form a contact hole that exposes the substrate;

forming a barrier layer on the interlevel-insulating layer including sidewalls of the interlayer insulating layer that define the contact hole and on an exposed portion of the substrate;

forming a first sacrificial layer on the barrier layer;

etching the first sacrificial layer and the barrier layer so as to expose the interlayer-insulating layer;

forming a mold layer on the interlevel-insulating layer and the first sacrificial layer in the contact hole;

patterning the mold layer to form an opening that exposes the first sacrificial layer in the contact hole;

etching the first sacrificial layer so as to expose the barrier layer in the contact hole;

forming a lower electrode of a capacitor in the opening that has a contact plug portion that is disposed in the contact hole, the lower electrode having a cylindrical shape that partially fills the opening along sidewalls of the mold layer;

forming a second sacrificial layer in the opening on the lower electrode;

etching the second sacrificial layer using the mold layer as an etch stop layer;

etching at least a portion of the mold layer;

forming a dielectric layer on the lower electrode of the capacitor and on the interlevel-insulating layer; and forming an upper electrode of the capacitor on the dielectric layer.

15. The method of claim 14, wherein etching at least the portion of the mold layer comprises:

etching the second sacrificial layer so as to expose sidewalls and a bottom surface of the lower electrode.

* * * * *

UNITED STATES PATENT AND TRADEMARK OFFICE
CERTIFICATE OF CORRECTION

PATENT NO. : 6,884,673 B2 Page 1 of 1
DATED : April 26, 2005
INVENTOR(S) : Joo et al.

It is certified that error appears in the above-identified patent and that said Letters Patent is hereby corrected as shown below:

Column 9,
Line 29, should read -- boundary therebetween, the lower electrode being --.

Signed and Sealed this

Sixteenth Day of August, 2005

JON W. DUDAS
*Director of the United States Patent and Trademark Office*